(12) United States Patent
Tauzin et al.

(10) Patent No.: US 7,927,980 B2
(45) Date of Patent: Apr. 19, 2011

(54) METHOD FOR FORMING A DETACHABLE SUBSTRATE INCLUDING IMPLANTATION AND EXFOLIATION

(75) Inventors: Aurélie Tauzin, St Martin le Vinoux (FR); Chrystelle Lagahe-Blanchard, St. Joseph de Riviere (FR)

(73) Assignee: COMMISSARIAT a l'Energie Atomique, Paris (FR)

( * ) Notice: Subject to any disclaimer, the term of this patent is extended or adjusted under 35 U.S.C. 154(b) by 388 days.

(21) Appl. No.: 11/719,834

(22) PCT Filed: Nov. 25, 2005

(86) PCT No.: PCT/FR2005/050994
§ 371 (c)(1),
(2), (4) Date: May 21, 2007

(87) PCT Pub. No.: WO2006/090034
PCT Pub. Date: Aug. 31, 2006

(65) Prior Publication Data
US 2009/0149005 A1    Jun. 11, 2009

(30) Foreign Application Priority Data

Nov. 29, 2004   (FR) .................................... 04 52796

(51) Int. Cl.
*H01L 21/20*    (2006.01)
*H01L 21/36*    (2006.01)
*H01L 21/31*    (2006.01)
*H01L 21/469*   (2006.01)

(52) U.S. Cl. .................. 438/480; 438/481; 438/766

(58) Field of Classification Search .............. 438/480, 438/481, 766; 257/E21.09, E21.131, E21.258
See application file for complete search history.

(56) References Cited

U.S. PATENT DOCUMENTS

| 6,197,697 B1 * | 3/2001 | Simpson et al. ............. 438/705 |
| 6,271,101 B1 * | 8/2001 | Fukunaga ..................... 438/455 |
| 2005/0217565 A1 * | 10/2005 | Lahreche et al. ............... 117/84 |

OTHER PUBLICATIONS

K.J. Weber, et al., "Lift-off of silicon epitaxial layers for solar cell applications", 26th PVSC, Sep. 30-Oct. 3, 1997, Anaheim, CA, p. 107-110.
H. Raidt, et al., "Adhesion in growth of defect-free silicon over silicon oxide", J. Appl Phys. 80 (7), Oct. 1, 1996, p. 4101-4107.

* cited by examiner

*Primary Examiner* — William M. Brewster
(74) *Attorney, Agent, or Firm* — Oblon, Spivak, McClelland, Maier & Neustadt, L.L.P.

(57) ABSTRACT

The invention concerns a method for forming a growth mask on the surface of an initial crystalline substrate, comprising the following steps:
  formation of a layer of second material on one of the faces of the initial substrate of first material,
  formation of a pattern in the thickness of the layer of second material so as to expose the zones of said face of the initial substrate, said zones forming growth windows on the initial substrate,
the method being characterized in that the formation of the pattern is obtained by ion implantation carried out in the surface layer of the initial substrate underlying the layer of second material, the implantation conditions being such that they cause, directly or after a heat treatment, on said face of the initial substrate, the appearance of exfoliated zones of first material leading to the localized removal of the zones of second material covering the exfoliated zones of first material, thereby locally exposing the initial substrate and forming growth windows on the initial substrate.
The invention further concerns methods for forming a crystalline thin film and transferring this thin film onto a host substrate.

13 Claims, 3 Drawing Sheets

METHOD FOR FORMING A DETACHABLE SUBSTRATE INCLUDING IMPLANTATION AND EXFOLIATION

TECHNICAL FIELD

The invention concerns a method enabling the formation of a growth mask on a substrate. The invention further enables detachable substrates no be obtained, in other words substrates comprising a thin film on one of their faces, said thin film being detachable by the application of stresses for example.

STATE OF THE PRIOR ART

Electronic devices often comprise active thin films, in which electrical events take place. Said thin films are generally obtained by epitaxy on high purity monocrystalline substrates. However, the use of such substrates makes the manufacture of thin films costly. A means of obtaining cheaper thin films is to form what are known as detachable substrates. Said detachable substrates are weakened substrates comprising a surface layer, located between the surface of the substrate and a buried weakened zone. By applying stresses to the detachable substrate, one may detach she surface layer of the substrate and thereby obtain an active thin film.

These detachable substrates are compatible with the implementation of technological steps intended to manufacture components comprising active thin films. These detachable substrates have an increasing interest, particularly in the field of photovoltaic devices, where their use enables photovoltaic devices to be obtained at low cost.

Up to now, several authors have proposed methods for forming detachable substrates (see documents [1], [2], [3] referenced at the end of the description). Generally speaking, the known methods of forming detachable substrates comprise the following steps:

formation of a growth mask on a crystalline substrate, deposition of a crystal in the exposed zones of the substrate, in other words in the zones of the substrate not covered by the mask, under conditions such that the growth of the crystal starts in the exposed zones of the substrate, but continues laterally over the entire surface of the mask, continuing the deposition and the growth up to forming an active thin film of crystalline material of desired dimensions over the whole surface of the mask.

An additional step of detachment of the active thin film of crystalline material from the rest of the substrate enables a thin film to be obtained.

The step of formation of the growth mask on the crystalline substrate takes place, for example, by formation of a thermal oxide on the substrate, followed by a step of photolithography and a selective chemical attack. The steps of photolithography and chemical attack comprise the spreading of a photosensitive resin, the exposure of the resin according to a predefined mask, the selective etching of the exposed resin, a selective chemical attack to etch the oxide in the regions where the resin has been exposed/etched and a chemical elimination of the remaining resin. One therefore sees that the step of formation of the growth mask is a long and costly step.

DESCRIPTION OF THE INVENTION

One of the aims of the invention is to propose a novel method for forming a growth mask on a given substrate.

The invention therefore concerns a method for forming a growth mask on the surface of an initial crystalline substrate, comprising the following steps:

formation of a layer of second material on one of the faces of the initial substrate of first material, formation of a pattern in the thickness of the layer of second material so as to expose the zones of said face of the initial substrate, said zones forming growth windows on the initial substrate, the method being characterised in that the formation of the pattern is obtained by ion implantation carried out in the surface layer of the initial substrate underlying the layer of second material, the implantation conditions being such that they cause, directly or after a heat treatment, on said face of the initial substrate, the appearance of exfoliated zones of first material leading to the localised removal of the zones of second material covering the exfoliated zones of first material, thereby locally exposing the initial substrate and forming growth windows on the initial substrate.

The ion implantation of the initial crystalline substrate may be carried out by using gaseous species (such as H, He, noble gases), The implantation may be carried out by means of an ion beam or by plasma immersion.

The implantation conditions are chosen so that growth windows appear on the surface of the substrate at the level where certain zones of the surface of the initial substrate have been exfoliated, said exfoliated zones appearing directly after the ion implantation or if necessary after a heat treatment carried out after the implantation. Each exfoliated zone constitutes a growth window since the substrate is laid bare in said zones.

Advantageously, the formation of the layer of second material is obtained by oxidation of the face of the substrate of first material.

Advantageously, the formation of the layer of second material is formed by deposition (for example by plasma or PECVD) of the second material on a face of the initial substrate of first material.

The invention further concerns a method for forming at least one crystalline thin film on an initial crystalline substrate, characterised in that it comprises the following steps:

formation of a growth mask on at least one face of an initial crystalline substrate of first material according to the method of formation seen previously, formation of a crystalline thin film of third material on the face(s) of the substrate comprising the mask(s).

Note that the crystalline thin film may be continuous or discontinuous.

One thereby obtains a substrate known as detachable. One recalls that a detachable substrate is a substrate comprising a surface layer (comprising the thin film) delimited by the surface of the substrate and by a buried weakened zone. The substrate is known as detachable because it comprises a surface thin film that can be separated from the initial substrate by the application of stresses. The substrate comprises a buried weakened zone because the ion implantation also induces, in addition to the formation of exfoliated zones, the formation of a layer of buried microcavities at the level of the implanted zone.

According to one variant, one may form simultaneously two crystalline thin films on a same substrate, for example by forming a mask on the two opposing faces of an initial crystalline substrate, then forming two crystalline thin films on the two faces each comprising a mask.

The initial substrate is in a crystalline material thereby favouring the growth of the crystalline thin film in third material on its surface.

Preferably, the material forming the growth mask (second material) is a material that does not favour the growth of the thin film: the material forming the thin film will therefore firstly go onto the exposed zones of the initial substrate.

The formation of the thin film of third material is carried out under conditions such that the growth of the third material starts in the exposed zones of the crystalline substrate, then continues laterally until being able to cover the entire surface of the mask.

Advantageously, the formation of the thin film of third material is formed by lateral growth of the third material from the growth windows on the initial substrate. The lateral growth may be an ELOG growth (Epitaxial Lateral Overgrowth). The third material is thus going to grow from the growth windows where the initial substrate is uncovered and its surface is exfoliated, the crystalline structure of the third material being obtained thanks to the crystalline structure of the initial substrate.

Advantageously, the first material and the third material are identical. The initial substrate may thus be a crystalline substrate covered by a mask in a second material, said material constituting a masking layer for the deposition and the growth of a crystalline thin film identical to the substrate. One then obtains a detachable substrate comprising on one of its faces a crystalline thin film of same material as the initial substrate, which may be separated from the substrate by the application of stresses.

The invention further enables thin films to be obtained from substrates.

The invention concerns a method for forming a crystalline thin film, comprising the following steps:
- formation of a crystalline thin film on a face of an initial crystalline substrate of first material comprising a growth mask of second material according to the method for forming a crystalline thin film on a crystalline substrate seen previously,
- detachment of the crystalline thin film from the initial crystalline substrate.

One thereby obtains firstly a crystalline thin film of third material of desired dimensions (particularly thickness), and secondly a recyclable crystalline substrate of first material.

Advantageously, the detachment of the thin film of the initial substrate is obtained by the application of mechanical and/or chemical stresses. These may be traction and/or shear mechanical stresses. The detachment may result from the application of opening stresses at the level of the buried weakened zone (in other words the zone where the microcavities are located), or instead a selective chemical attack of the weakened layer and/or the layer of second material (mask). The detachment may also result from a combination of these methods.

Finally, the invention concerns a method for transferring a crystalline thin film onto a host substrate, said method comprising the following steps:
- formation of a crystalline thin film of third material on a face of an initial crystalline substrate of first material comprising a growth mask of second material according to the method for forming a crystalline thin film on a crystalline substrate seen previously,
- bringing into contact and adhesion of the crystalline thin film on a face of a host substrate,
- detachment of the crystalline thin film of the initial crystalline substrate so as to separate the initial substrate from the host substrate, the host substrate supporting the crystalline thin film.

Advantageously, the adhesion of the thin film on a face of a host substrate is obtained by forming an adhesion layer on the thin film and/or on the host substrate. As a variant, the adhesion may be obtained through bonding by molecular adhesion.

Advantageously, the step of detachment of the thin film is carried out by applying mechanical and/or chemical stresses. One may thereby apply mechanical stresses to the bonded structure, for example at the level of the buried weakened zone. The mechanical stress may consist in inserting a blade between the initial substrate and the host substrate and/or applying traction and/or flexion and/or shear stresses to the bonded structure. One may also apply to the bonded structure ultrasounds or microwaves of judiciously chosen power and frequency.

Advantageously, the method for transferring a crystalline thin film onto a host substrate according to the invention further comprises, after the step of formation of the crystalline thin film, a step of chemical attack of the growth mask of second material. This additional step makes it possible to facilitate the detachment of the thin film. This step may be carried out before or after the bonding on the host substrate.

The different methods according to the invention have numerous advantages compared to the prior art.

The method for forming a growth mask enables a growth mask to be formed at low cost. Indeed, with this method, the steps of photolithography and selective etching are advantageously replaced by a simple step of ion implantation.

Moreover, the presence of microcavities induced by the implantation makes it possible to locally weaken the initial substrate, which makes it possible to facilitate the step of detachment of the thin film in the method for forming a crystalline thin film or the method for transferring a crystalline thin film onto a host substrate.

The sizes and densities of the exfoliated zones, but also those of the microcavities, are controlled and easily adaptable. Indeed, these parameters depend mainly on the implantation conditions (in other words the dose, the energy and the implantation temperature) and the conditions of any post-implantation heat treatment (temperature, time, temperature ramps, atmosphere) applied for a determined initial substrate and thin film. One may thereby modulate the distribution of the growth windows on the initial substrate as well as the brittleness level of the buried weakened zone by judiciously choosing the conditions of the ion implantation and, if necessary, of the heat treatment.

BRIEF DESCRIPTION OF DRAWINGS

The invention will be more fully understood, and other advantages and specific features will become clear on reading the description that follows, given by way of example and in nowise limitative, along with the appended drawings among which.

DETAILED DESCRIPTION OF SPECIFIC EMBODIMENTS

In a first example, we are going to illustrate the invention by means of an embodiment of a detachable silicon substrate composed of a substrate of silicon comprising on one of its faces a thin film of silicon.

Figure 1A:
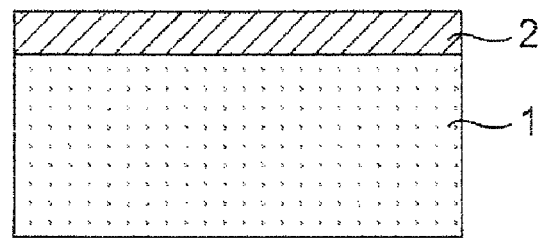
FIGS. 1A to 1C show the different steps of the method for forming a mask on an initial substrate according to the invention.

An initial substrate 1 of oriented monocrystalline silicon (100) or (111) is used and is subjected to a thermal oxidation. This oxidation layer of silica is going to allow us to form a growth mask on one or even two faces of this initial silicon substrate. The oxidation of the silicon substrate is carried out so as to obtain a layer of silicon oxide having a determined thickness. The thickness of this layer must indeed be sufficiently low so that the subsequent ion implantation attains the silicon substrate, but sufficient to form a masking layer for the subsequent growth of the thin silicon film. Here, the oxidation is obtained by placing the silicon substrate in an oven at 1100° C. under oxygen flow at 760 Torr for around 2½ hours or at 900° C. under water vapour flow at 760 Torr for 50 minutes for example. One thereby obtains a layer of oxide 2 of 200 nm thickness on an initial silicon substrate 1 (see FIG. 1A).

Figure 1B:
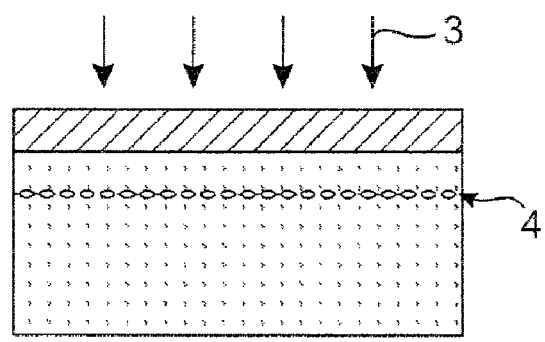
Figure 1C:
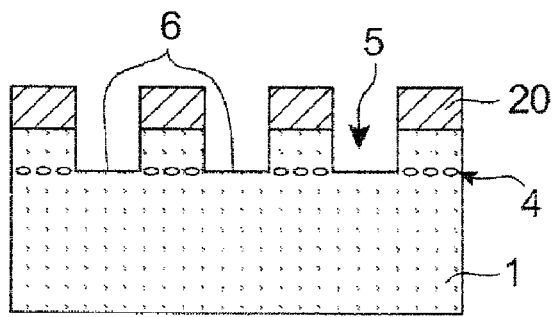
Figure 2:
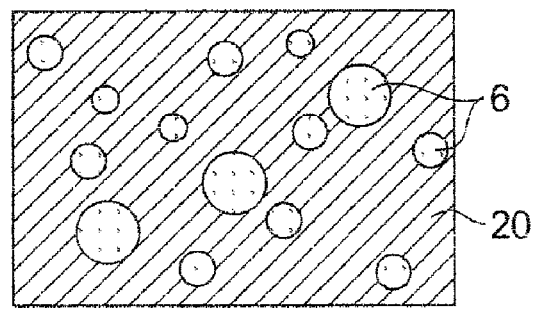
FIG. 2 is a top view of a detail of FIG. 1C, FIGS. 3A to 3D illustrate the steps of the method for transferring the thin film onto a host substrate.

According to a first variant, a step of ion implantation 3 of the silicon substrate (FIG. 1B) is then carried out at around 40 KeV with $H^+$ ions at $1.10^{17}$ $H^+/cm^2$. This specific dose of $H^+$ ions induces the formation of buried microcavities 4 in the silicon substrate and exfoliated zones 5 on the surface of the substrate forming growth windows 6 on the initial substrate (FIG. 1C and FIG. 2). Given the implantation energy used, the buried microcavities are located at a depth of around 250 nm under the surface of the substrate 1, i.e. at a depth of 450 nm under the surface of the oxide 2. One thereby has a growth mask 20 on the silicon substrate 1.

According to a second variant, the step of ion implantation may be carried out at around 40 KeV with $H^+$ ions at $5.10^{16}$ $H^+/cm^2$. The ion implantation may then be followed by a heat treatment in the range of temperature going from 350° C. to 1100° C. The heat treatment enables the development of buried microcavities and the formation of exfoliated zones on the surface of the substrate by increasing the gas pressure within these microcavities. Advantageously, the post-implantation heat treatment is carried out in the same epitaxy jig as that used for the growth of the thin film. This makes it possible to avoid the handling and/or the contamination of the structures between these two steps.

In another variant, the implantation may be carried out before the deposition of the oxide serving to form the mask. One will assure in this case that the layer of oxide deposited has a sufficiently low-thickness to avoid having a stiffening effect leading to the fracture of the structure at the level of the buried weakened zone created by the implantation.

One thereby obtains a growth mask 20 having growth windows 6 (at the level of exfoliated zones 5 of the silicon substrate 1) of sizes, depths and densities controlled by the experimental implantation conditions (dose, energy, temperature) and/or heat treatment (temperature, time, ramp) and/or the choice of materials of the substrate and the mask, said growth windows giving access to the initial substrate at the levels of the exfoliated zones 5 of the initial substrate 1 as illustrated in FIG. 2.

As a variant, the implantation may be carried out not by ion bombardment but by plasma immersion. This technique has the advantage of being able to act simultaneously on the two faces of the substrate.

Figure 3A:
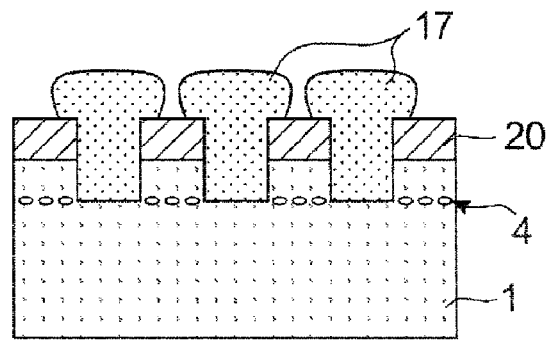
Figure 3B:
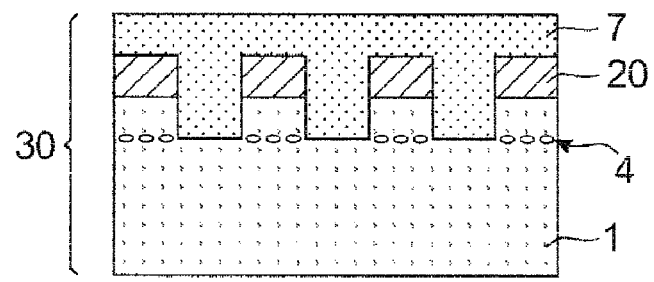

On the face(s) of the substrate 1 comprising the growth mask 20, one then forms the thin film 7 of silicon and one thereby obtains a detachable substrate 30 (FIG. 3B). This thin film 7 may be obtained by lateral growth (ELOG) of crystalline silicon from the zones of the silicon substrate laid bare (in other words at the level of the growth windows 6). This technique makes it possible to favour the lateral growth of silicon compared to its vertical growth. Thus, as it grows, the silicon progressively covers the growth mask (see FIG. 3A where the silicon is represented in the form of champagne corks 17 projecting out onto the space constituted by the exfoliated zones 5). Advantageously, the growth is continued until the coalescence of the silicon over the whole surface of the growth mask is obtained (see FIG. 3B). This results in the formation of a continuous epitaxial layer 7, of desired thickness and of crystalline quality. The thin film 7 thereby formed may have a thickness of 50 µm for example.

The ELO technique is well known to those skilled in the art. In the case of silicon, the ratio between the rates of lateral and vertical growths depend in particular on the crystallographic orientation of the substrate and is maximal for the substrates (111). The ELO epitaxial growth begins at the level of the growth windows of the mask, then the crystallisation of the layers above the mask takes place by two dimensional nucleation. The ELO growth makes it possible to favour covering of the oxide rather than vertical growth. A coalescence of the epitaxied silicon is thereby possible and one obtains a final flat epitaxied layer, continuous, without dislocations and with a surface roughness on the atomic scale. In the case of oriented substrates (100), the growth takes place preferentially along the planes <111>. Firstly, one observes the formation of pyramids of angle at the base of 54.7° in each growth window of the mask. Then, as the growth proceeds, there is coalescence of said pyramids by covering of the oxide of the mask when the pyramids are big enough and close enough.

The growth of the thin film of silicon may be carried out in a standard liquid phase epitaxy jig. To do this, one introduces at the same time the substrate to be epitaxied (constituted of the initial silicon substrate 1 at least one face of which is covered with a growth mask in silicon oxide 20) as well as a growth bath composed of silicon and a solvent (tin or indium) in an epitaxy oven under a flow of ultra-pure $H_2$. The substrate to be epitaxied and the growth bath are then raised to high temperature (around 950° C.) for around 2 hours, until the growth bath, having become liquid, is saturated with silicon. Once saturated, the growth bath is brought into contact with the silicon substrate to be epitaxied. Finally, the bath and the growth substrate are then cooled slowly (0.5° C./min ramp), in order that the bath and the growth substrate follow the liquid-solid thermodynamic equilibrium curve of the chosen Si-solvent system. The epitaxied thin film 7 of silicon thereby has the same crystallographic characteristics as the initial substrate 1. Knowing that the growth rates are around 0.1 to 1 µm/min, the growth of a layer of 50 µm of silicon <111> takes around 2 h.

Figure 3C:
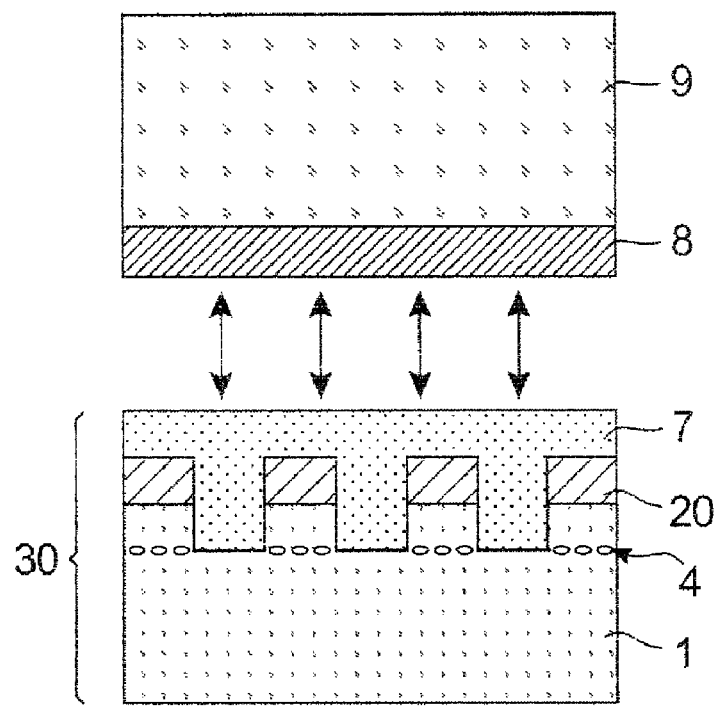

From this thin film of crystalline silicon, one may then form components such as photovoltaic cells. These components may then be transferred onto an inexpensive support. To do this, the detachable substrate 30 is all or part bonded, onto a final inexpensive support along the face comprising the thin film 7 (FIG. 3C). One may for example carry out the bonding by depositing an adhesion layer 8 on a face of the host substrate 9. The adhesion layer 8 may be obtained by using ceramic adhesives or polymer adhesives for example, and the final support (host substrate 9) may be a ceramic support. As a variant, the bonding may be carried out by molecular adhesion. One then detaches all or part of the thin film 7 from its initial substrate 1 by applying a detachment stress to the bonded structure. One may for example insert a blade between the initial substrate 1 and the host substrate 9 and/or apply traction and/or flexion and/or shear stresses to the bonded structure, and/or apply at the level of the zone of buried microcavities and/or the mask/thin film interface ultrasounds or microwaves of judiciously chosen power and frequency. The detachment may take place at the level of the interface between the thin film 7 and the mask of thermal oxide 20, and/or at the level of the mask of thermal oxide 20

Figure 3D:
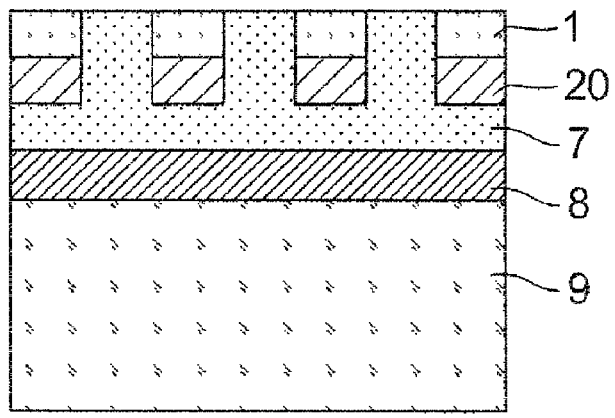

(more fragile than silicon) and/or at the level of the microcavities zone 4 located in the initial substrate 1. The crystalline initial substrate may then be recycled or reused to form other thin films. In FIG. 3D, one has represented a thin film 7 transferred onto a host substrate 9 in which the separation with the initial substrate has taken place at the level of the zone of microcavities. The thin film 7 thereby comprises the mask 20 and a remainder of the initial substrate 1. According to a detachment variant, one may after formation of the thin film 7, continuous or discontinuous, carry out a selective chemical attack to eliminate all or part of the growth mask before or after bonding of the host substrate. This step facilitates the detachment of the thin film for example by application of simultaneous or subsequent mechanical stresses.

Advantageously, after the transfer, one may carry out a selective chemical attack or a step of mechanical-chemical polishing making it possible to eliminate the zones of thermal oxide (the mask 20), integral with the thin film, so as only to conserve the thin film 7 transferred onto the substrate 9. This layer may undergo technological operations (deposition, etching) necessary to form components.

Another embodiment of a detachable substrate is presented below. An initial substrate of oriented monocrystalline germanium (100) or (111) is used. On said substrate, a layer of $SiO_2$ of thickness 250 nm is deposited by PECVD (Plasma Enhanced Chemical Vapour Deposition).

According to a first variant, one carries out an ion implantation of the substrate with a quantity of $H^+$ ions of $1.10^{17}$ $H^+/cm^2$ at an energy of 80 KeV. These implantation conditions induce the formation of buried microcavities at a determined depth of the substrate and the appearance of exfoliated zones on the surface of the substrate. At the outcome, the layer of silica has growth windows that lay bare the underlying substrate of germanium.

According to a second variant, the step of implantation is carried out with a dose of ions of $5.10^{16}$ $H^+/cm^2$ at an energy of 80 KeV. This step is followed by a heat treatment carried out at a temperature between 350° C. and 500° C. Advantageously, the post-implantation heat treatment is carried out in an epitaxy jig.

As a variant, the implantation may be carried out before the deposition of the mask.

One thereby obtains a growth mask having growth windows of size, depth and densities controlled by the experimental conditions.

On such a substrate provided with its growth mask, one carries out a deposition or a growth of germanium from the zones of germanium laid bare (exfoliated zones visible in the growth windows of the mask). The growth may for example be carried out in a standard liquid phase epitaxy jig. To do this, one uses a growth bath composed of germanium and a solvent (for example a solvent containing lead). The growth bath and the substrate to be epitaxied, provided with its growth mask, are introduced at the same time into an oven. The oven is flushed with argon, then the system is placed under vacuum at $5.10^{-6}$ Torr. The oven is then raised to 300° C. under ultrapure $H_2$ flow (the flow rate of $H_2$ is 1 L/min). The growth bath and the substrate to be epitaxied are raised to high temperature (around 655° C.) for around 5½ hours, until the growth bath, having become liquid, is saturated with germanium. Once saturated, the growth bath is brought into contact with the germanium substrate to be epitaxied at a temperature of around 653° C. The slight temperature difference (around 2° C.) compared to the saturation temperature enables the growth to be initiated. The bath and the growth substrate are then cooled to a temperature of 340° C. over 12 hours. The thickness of the epitaxial layer thereby obtained is around 35 to 50 μm.

From this thin film of germanium, one may carry out certain technological steps for manufacturing components, such as for example the formation of photovoltaic cells. These components may again be transferred onto a host substrate. For example, one may transfer all or part of the epitaxial layer of germanium, if necessary treated, onto a support other than the initial substrate. To do this, one bonds the thin film of germanium onto an inexpensive final support (for example a host substrate in ceramic) by using an adhesion layer (ceramic adhesives, polymer adhesives, etc.). Then, by the application of a detachment stress, one detaches the thin film of germanium from its initial substrate. The detachment may take place at the level of the thin film/silicon oxide interface, and/or in the layer of silicon oxide (more fragile than germanium) and/or at the level of the zone of microcavities of the initial substrate. The detachment may be obtained by inserting a blade between the two substrates, in other words the initial substrate and the host substrate, and/or by applying traction and/or flexion and/or shear stresses to the initial substrate, and/or by applying ultrasounds or microwaves of judiciously chosen power and frequency to the initial substrate. According to a variant, one may carry out a selective chemical attack to etch the oxide zones of the growth mask, in combination with the application of a detachment stress in order to facilitate the detachment.

Advantageously, the remainder of the initial substrate and of the growth mask are eliminated chemically and/or by mechanical-chemical polishing so as to restore a good surface condition to the transferred layer 7. Different technological steps for manufacturing components may then be carried out on the transferred layer 7 (for example a PECVD deposition, an etching, a serigraphy).

BIBLIOGRAPHY

[1] Patent WO81/02948, April 1980
[2] K. J. Weber, "Lift-off of silicon epitaxial layers for solar cell applications", 26t PVSC, 1997, Anaheim, Calif.
[3] H. Raidt, "Adhesion in growth of defect-free silicon over silicon oxide", J. Appl. Phys. 80 (7), 1996, p 4101

The invention claimed is:
1. A method for forming a growth mask on the surface of an initial crystalline substrate to form a growth window on the initial crystalline substrate, comprising:
   forming a continuous layer of second material on one of the faces of the initial substrate of first material,
   forming a pattern in the thickness of the layer of second material so as to expose zones of said face of the initial substrate, said zones forming the growth windows on the initial crystalline substrate,
   wherein the pattern is obtained by performing an ion implantation in the surface layer of the initial substrate underlying the continuous layer of second material, the implantation conditions being such that they cause, directly or after a heat treatment, the appearance of exfoliated zones of first material on said face of the initial substrate, leading to the localized removal of the zones of second material covering the exfoliated zones of first material, thereby locally exposing the initial substrate and forming growth windows on the initial crystalline substrate.

2. The method for forming a mask according to claim 1, wherein forming the continuous layer of second material is obtained by oxidizing the face of the substrate of first material.

3. The method for forming a mask according to claim 1, wherein the continuous layer of second material is formed by depositing the second material on a face of the initial substrate of first material.

4. A method for forming at least one crystalline thin film on an initial crystalline substrate, comprising:
forming a growth mask on at least one face of an initial crystalline substrate of first material according to the method of claim 1,
forming a crystalline thin film of third material on the face(s) of the substrate comprising the mask(s).

5. The method for forming at least one thin film according to claim 4, wherein forming the thin film of third material is carried out by lateral growth of the third material from growth windows on the initial substrate.

6. The method for forming at least one thin film according to claim 4, wherein the first material and the third material are identical.

7. A method for forming a crystalline thin film, comprising:
forming a crystalline thin film on a face of an initial crystalline substrate of first material comprising a growth mask of second material according to the method of claim 4,
detaching the crystalline thin film from the initial crystalline substrate.

8. The method for forming a thin film according to claim 7, wherein the detachment of the thin film from the initial substrate is obtained by applying mechanical and/or chemical stresses.

9. A method for transferring a crystalline thin film onto a host substrate, said method comprising:
forming a crystalline thin film of third material on a face of an initial crystalline substrate of first material comprising a growth mask of second material according to the method of claim 4,
contacting and adhering the crystalline thin film on a face of a host substrate,
detaching the crystalline thin film from the initial crystalline substrate so as to separate the initial substrate from the host substrate, the host substrate supporting the crystalline thin film.

10. The method for transferring a crystalline thin film onto a host substrate according to claim 9, wherein the adhesion of the thin film on a face of a host substrate is obtained by forming an adhesion layer on the thin film and/or on the host substrate.

11. The method for transferring a crystalline thin film onto a host substrate according to claim 9, wherein the adhesion of the thin film on a face of a host substrate is obtained through bonding by molecular adhesion.

12. The method for transferring a crystalline thin film onto a host substrate according to claim 9, wherein detaching the thin film is carried out by applying mechanical and/or chemical stresses.

13. The method for transferring a crystalline thin film onto a host substrate according to claim 9, further comprising, after forming the crystalline thin film, chemically attacking the growth mask of second material.

* * * * *